United States Patent
Kim

(10) Patent No.: US 11,450,377 B2
(45) Date of Patent: Sep. 20, 2022

(54) APPARATUSES AND METHODS INCLUDING MEMORY CELLS, DIGIT LINES, AND SENSE AMPLIFIERS

(71) Applicant: MICRON TECHNOLOGY, INC., Boise, ID (US)

(72) Inventor: Tae H. Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/942,588

(22) Filed: Jul. 29, 2020

(65) Prior Publication Data

US 2022/0036940 A1    Feb. 3, 2022

(51) Int. Cl.
*G11C 11/4091*    (2006.01)
*G11C 11/22*      (2006.01)
*G11C 11/4094*    (2006.01)

(52) U.S. Cl.
CPC ........ *G11C 11/4091* (2013.01); *G11C 11/221* (2013.01); *G11C 11/2255* (2013.01); *G11C 11/2259* (2013.01); *G11C 11/2273* (2013.01); *G11C 11/4094* (2013.01)

(58) Field of Classification Search
CPC ............ G11C 11/4091; G11C 11/2255; G11C 11/2259; G11C 11/4094; G11C 11/2273; G11C 11/221

See application file for complete search history.

(56) References Cited

U.S. PATENT DOCUMENTS

| 5,978,250 | A  | * | 11/1999 | Chung .................... G11C 11/22 365/145 |
| 7,443,713 | B2 | * | 10/2008 | Schroder ............... G11C 11/404 257/E21.657 |
| 2003/0002351 | A1 | * | 1/2003 | Beer .................... G11C 11/4085 365/189.07 |
| 2018/0061468 | A1 | * | 3/2018 | Derner .............. H01L 27/11507 |
| 2020/0343244 | A1 | * | 10/2020 | Onuki ................. H01L 29/7869 |

* cited by examiner

*Primary Examiner* — Tri M Hoang
(74) *Attorney, Agent, or Firm* — Dorsey & Whitney LLP

(57) ABSTRACT

Apparatuses and methods including memory cells, digit lines, and sense amplifiers are described. An example apparatus includes a pair of digit lines including first and second digit lines, a sense amplifier coupled to the pair of digit lines and configured to amplify a voltage difference between the first and second digit lines when activated, and a plurality of memory cells. A memory cell of the plurality of memory cells includes a first node coupled to the first digit line and includes a second node coupled to the second digit line. The memory cell of the plurality of memory cells is configured to store a respective voltage and/or charge at a respective cell node and couple the respective voltage and/or charge to the first node when activated.

14 Claims, 11 Drawing Sheets

APPARATUSES AND METHODS INCLUDING MEMORY CELLS, DIGIT LINES, AND SENSE AMPLIFIERS

BACKGROUND

Memory devices are structured to have one or more arrays of memory cells that are arranged, at least logically, in rows and columns. Each memory cell stores data as an electrical voltage and/or charge that is accessed by a digit line associated with the memory cell. A charged memory cell, when the memory cell is accessed, causes a positive change in voltage on the associated digit line, and an accessed memory cell that is not charged causes a negative change in voltage on the associated digit line. A voltage difference between digit lines of a digit line pair resulting from the change in voltage may be sensed and amplified by a sense amplifier to indicate the value of the data state stored in the memory cell.

Sense amplifiers are typically coupled to a pair of complementary digit lines to which a large number of memory cells (not shown) are connected. As known in the art, when memory cells are accessed, a row of memory cells are activated and sense amplifiers are used to amplify a data state for the activated memory cells by coupling each of the digit lines of the selected column to voltage supplies such that the digit lines have complementary logic levels.

When a memory cell is accessed, the voltage of one of the digit lines increases or decreases slightly, depending on whether the memory cell coupled to the digit line is charged or not, resulting in a voltage difference between the digit lines. Typically, while the voltage of one digit line increases or decreases slightly, the other digit line does not and serves as a reference for the sensing operation. Based on the resulting voltage difference, activated sense amplifiers amplify the difference to provide the data states of the accessed memory cells.

As operating voltages of memory devices and physical layouts of memory arrays continue to decrease, the resulting voltage difference of digit lines from accessing memory cells has also decreased, creating challenges for sense amplifiers to accurately sense and amplify data states of the memory cells.

DETAILED DESCRIPTION

Certain details are set forth below to provide a sufficient understanding of examples of the invention. However, it will be clear to one having skill in the art that examples of the invention may be practiced without these particular details. Moreover, the particular examples of the present invention described herein should not be construed to limit the scope of the invention to these particular examples. In other instances, well-known circuits, control signals, timing protocols, and software operations have not been shown in detail in order to avoid unnecessarily obscuring the invention. Additionally, terms such as "couples" and "coupled" mean that two components may be directly or indirectly electrically coupled. Indirectly coupled may imply that two components are coupled through one or more intermediate components.

Various embodiments of the present disclosure will be explained below in detail with reference to the accompanying drawings. The following detailed description refers to the accompanying drawings that show, by way of illustration, specific aspects and embodiments of the disclosure. The detailed description includes sufficient detail to enable those skilled in the art to practice the embodiments of the disclosure. Other embodiments may be utilized, and structural, logical and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
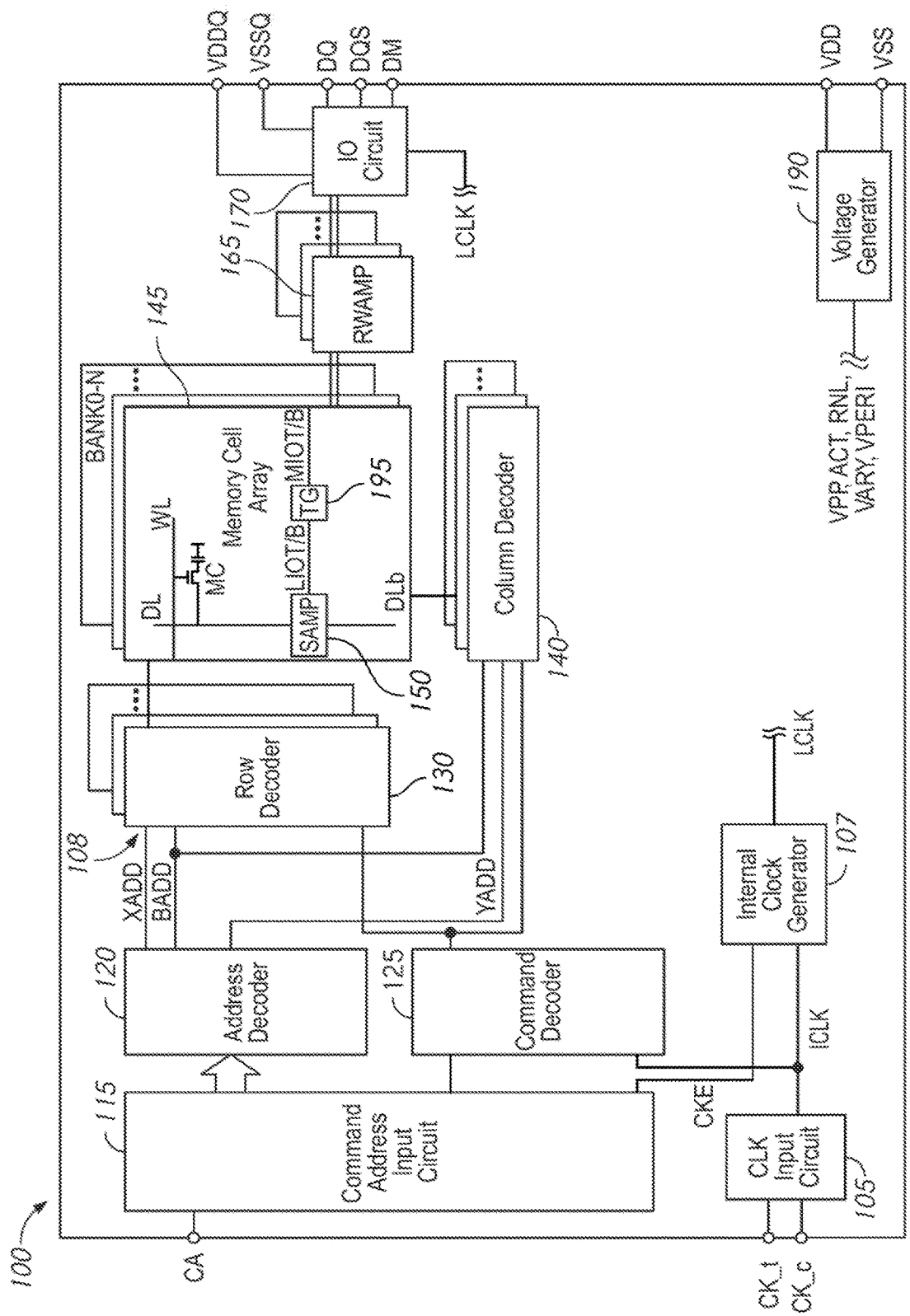
FIG. 1 is a schematic block diagram of a semiconductor device in accordance with an embodiment of the present disclosure.

FIG. 1 is a schematic block diagram of a semiconductor device 100, in accordance with an embodiment of the present disclosure. The semiconductor device 100 may include a clock input circuit 105, an internal clock generator 107, an address command input circuit 115, an address decoder 120, a command decoder 125, a plurality of row (e.g., access line) decoders 130, a memory cell array 145 including sense amplifiers 150, memory cells MC, and transfer gates 195, a plurality of column decoders 140, a plurality of read/write amplifiers 165, an input/output (I/O) circuit 170, and a voltage generator 190.

The semiconductor device 100 may include a plurality of external terminals including command/address terminals CA, clock terminals CK_t and CK_c, data terminals DQ, DQS, and DM, and power supply terminals VDD, VSS, VDDQ, and VSSQ.

In other examples, the terminals and signal lines associated with the command/address terminal CA may include shared terminals and signal lines that are configured to receive both command signal and address signals. In some examples, the terminals and signal lines associated with the command/address terminal CA may include a first set of terminals and signal lines that are configured to receive the command signals and a separate, second set of terminals and signal lines that configured to receive the address signals, in some examples. The semiconductor device may be mounted on a substrate, for example, a memory module substrate, a motherboard or the like.

The memory cell array 145 includes a plurality of banks BANK0-N, where N is a positive integer, such as 3, 7, 15, 31, etc. Each bank BANK0-N may include a plurality of word (access) lines WL, a plurality of digit lines DL, and a plurality of memory cells MC arranged at intersections of the plurality of word lines WL and the plurality of digit lines DL and DLb. The selection of the word line WL for each bank BANK0-N is performed by a corresponding row decoder 130 and the selection of the digit lines DL and DLb is performed by a corresponding column decoder 140. The digit lines DL and DLb are coupled to a respective one of a plurality of sense amplifiers SAMP 150. The plurality of sense amplifiers 150 are coupled to at least one respective local I/O line pairs LIOT/B that is further coupled to a respective one of at least two main I/O line pairs MIOT/B, via transfer gates TG 195. The sense amplifiers 150 and transfer gates TG 195 may be operated based on control signals from decoder circuitry, which may include the command decoder 125, the row decoders 130, the column decoders 140, any control circuitry of the memory cell array 145 of the banks BANK0-N, or any combination thereof.

The command/address input circuit 115 may receive an address signal and a bank address signal from outside at the command address terminals and transmit the address signal and the bank address signal to the address decoder 120. The address decoder 120 may decode the address signal received from the command/address input circuit 115 and provide a row address signal XADD to the row decoder 130, and a column address signal YADD to the column decoder 140. The address decoder 120 may also receive the bank address signal and provide the bank address signal BADD to the row decoder 130 and the column decoder 140.

The command/address input circuit 115 may receive a command signal from outside, such as, for example, a memory controller at the command address terminals and provide the command signal to the command decoder 125. The command decoder 125 may decode the command signal and generate various internal command and control signals. The internal command and control signals may be used to control operation and timing of various circuits of the semiconductor device 100. For example, the internal command signals may include row and column command signals to control circuits to perform access operations to selected word lines and digit lines, such as a read command or a write command.

When an activate command is issued and a row address is timely supplied with the activate command, and a column address is timely supplied with a read command, read data is read from a memory cell in the memory cell array 145 designated by the row address and the column address. The read/write amplifiers 165 may receive the read data DQ and provide the read data DQ to the IO circuit 170. The IO circuit 170 may provide the read data DQ to outside via the data terminals DQ, DQS and DM together with a data strobe signal at DQS and a data mask signal at DM. Similarly, when an activate command is issued and a row address is timely supplied with the activate command, and a column address is timely supplied with a write command, write data supplied to the data terminals DQ, DQS, DM, together with a data strobe signal at DQS and a data mask signal at DM are written via the read/write amplifiers 165 to the memory cell array 145. Thus, the write data may be written in the memory cell designated by the row address and the column address.

The clock terminals CK_t and CK_c may receive an external clock signal and a complementary external clock signal, respectively. The external clock signals (including complementary external clock signal) may be supplied to a clock input circuit 105. The clock input circuit 105 may receive the external dock signals and generate an internal clock signal ICLK. The clock input circuit 105 may provide the internal clock signal ICLK to an internal clock generator 107. The internal clock generator 107 may generate a phase controlled internal clock signals LCLK based on the received internal clock signal ICLK and a clock enable signal CKE from the address/command input circuit 115. The internal clock generator 107 may provide the phase controlled internal clock signals LCLK to the IO circuit 170. The IO circuit 170 may use the phase controlled internal clock signals LCLK as timing signals for determining an output timing of read data.

The power supply terminals may receive power supply voltages VDD and VSS. These power supply voltages VDD and VSS may be supplied to a voltage generator circuit 190. The voltage generator circuit 190 may generate various internal voltages, VPP, VARY, ACT, RNL, VPERI, and the like based on the power supply voltages VDD and VSS. The internal voltage VPP may be used in the row decoder 130, the internal voltages VARY, ACT, and RNL may be used in the sense amplifiers 150 included in the memory cell array 145, and the internal voltage VPERI may be used in other circuit blocks. The IO circuit 170 may receive the power supply voltages VDDQ and VSSQ. In some examples, the power supply voltages VDDQ and VSSQ may be the same voltages as the power supply voltages VDD and VSS, respectively. However, the dedicated power supply voltages VDDQ and VSSQ may be used for the IO circuit 170.

Figure 2:
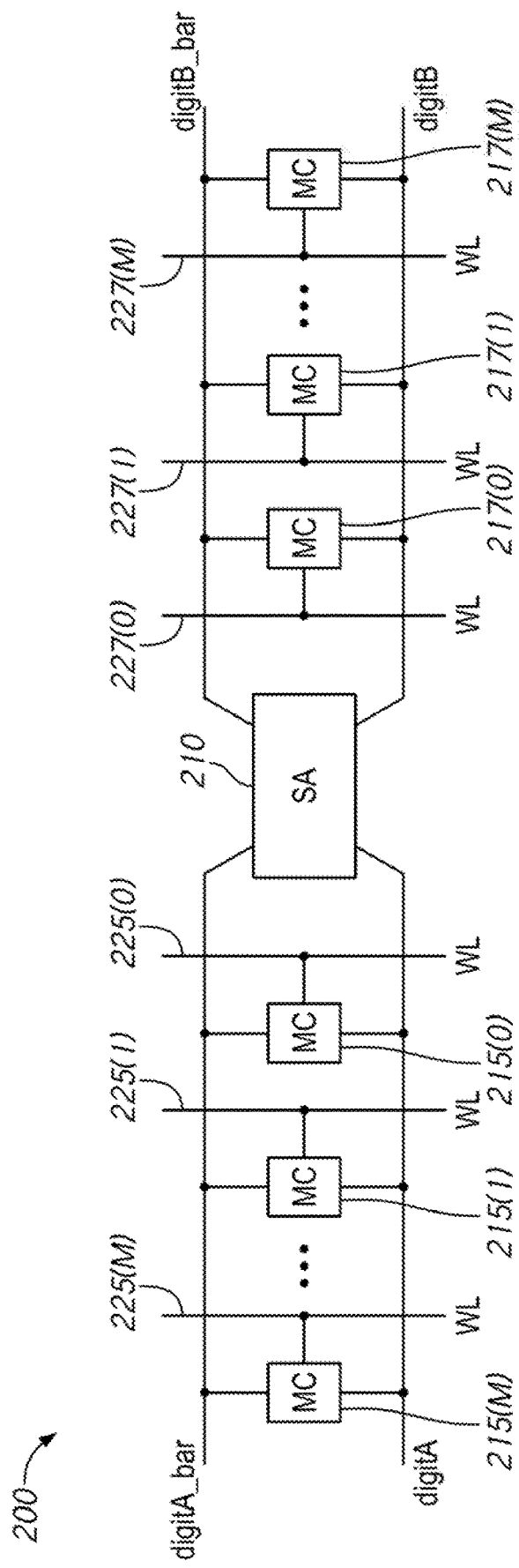
FIG. 2 is a diagram of a portion of a memory that includes a sense amplifier and memory cells coupled to pairs of digit lines according to an embodiment of the disclosure.

FIG. 2 is a diagram of a portion of a memory 200 that includes a sense amplifier and memory cells coupled to pairs of digit lines according to an embodiment of the disclosure. The portion of memory 200 may be included in the semiconductor device 100 in some embodiments of the disclosure.

A sense amplifier 210 is coupled to pairs of digit lines digitA and digitA_bar, and digitB and digitB_bar. Each digit line of a digit line pair is coupled to the sense amplifier 210 (e.g., digit line pair digitA and digitA_bar, and digit line pair digitB and digitB_bar). Memory cells 215(0)-215(M) are coupled to the digit line digitA and the digit line digitA_bar, and further coupled to a respective one of access lines WL 225(0)-225(M). Memory cells 217(0)-217(M) are coupled to the digit line digitB and the digit line digitB_bar, and further coupled to a respective one of access lines WL 227(0)-227(M).

In operation, one or more of the memory cells 215 and 217 are accessed by activating a respective access line WL 225 and 227 (e.g., changing the WL from a low voltage level to a high voltage level). In some embodiments, the memory cells 215 and 217 store data by storing a voltage and/or charge representing the stored data. When the memory cells is accessed, the stored voltage and/or charge changes a voltage of one or both the digit lines to create a voltage difference between the digit lines. The sense amplifier 210 amplifies a voltage difference between the digit lines by driving each of the digit lines to opposite voltage levels (e.g., a low voltage level and high voltage level) when the sense amplifier 210 is activated. The opposite voltage levels of the digit lines may be further provided to input/output lines of a data path (not shown in FIG. 2), for example, to provide read data externally from a memory device. Voltages from the input/output lines of the data path may be provided to the digit lines, for example, to provide write data to be stored by the accessed memory cell. Before another cell coupled to the digit lines can be accessed, the access line WL coupled to the currently accessed memory cell is deactivated (e.g., changing the WL from the high voltage level to the low voltage level). The memory cell stores the voltage level of one or both the digit lines when the access line is deactivated. The digit lines may be prepared for a following access by setting the digit lines to a known voltage level (e.g., a precharge voltage) and equalizing the voltage levels of the digit lines.

In an example operation, memory cell 215(0) is accessed by activating the access line 225(0). The activated access line 225(0) causes the memory cell 215(0) to couple a stored voltage and/or charge to one or both the digit lines digitA and digitA_bar, which results in a voltage difference between the digit lines digitA and digitA_bar. The sense amplifier 210 is activated and amplifies the voltage difference between the digit lines digitA and digitA_bar by driving the digit lines digitA and digitA_bar to opposite voltage levels. The voltage levels of the digit lines digitA and digitA_bar may be provided to input/output lines, such as for reading the data of the memory cell 215(0). Voltages of the input/output lines may also be provided to the digit lines digitA and digitA_bar to write data to the memory cell 215(0). The access line 225(0) is deactivated and the voltages of one or both the digit lines digitA and digitA_bar are stored by the memory cell 215(0). The digit lines digitA and digitA_bar may be precharged in preparation for another memory cell access operation.

Figure 3:
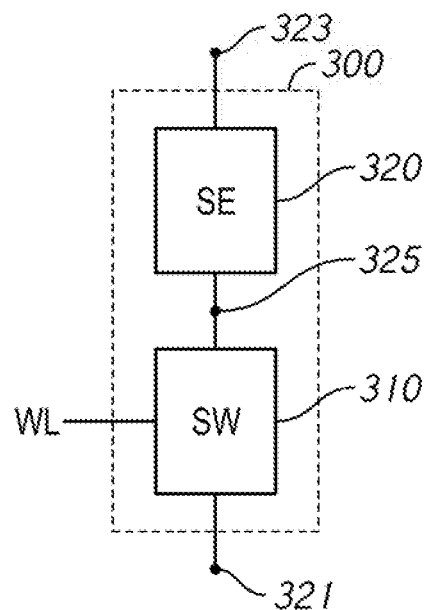
FIG. 3 is a diagram of a memory cell according to some embodiments of the disclosure.

FIG. 3 is a diagram of a memory cell 300 according to some embodiments of the disclosure. The memory cell 300 may be included in the memory cells 215 and/or 217 of FIG. 2 in some embodiments of the disclosure. The memory cell 300 may also be included in the memory cell MC of the semiconductor device 100 of FIG. 1 in some embodiments of the disclosure.

The memory cell 300 may include a selection switch 310 and a storage element 320. The selection switch 310 may be coupled to the storage element 320 at a cell node 325. The memory cell 300 may store a voltage and/or charge, for example, at the cell node 325. The selection switch 310 is further coupled to an access line WL at a control node. Nodes 321 and 323 may be coupled to respective digit lines of a pair of digit lines. For example, the node 321 may be coupled to a digit line digit and the node 323 may be coupled to a digit line digit_bar, where the digit lines digit and digit_bar are included in a pair of digit lines. In some embodiments of the disclosure, the selection switch 310 may be a field effect transistor (FET), and a gate of the FET may be coupled to a control node, to which the access line WL is coupled. In some embodiments of the disclosure, the storage element 320 may be a capacitor. In some embodiments, the selection switch 310 and storage element 320 may be combined into a single element, that when activated create a voltage difference between the nodes 321 and 323.

In operation, the selection switch 310 is activated when the access line WL is activated (e.g., changing the access line voltage from a low voltage level to a high voltage level). When the selection switch 310 is activated, a voltage and/or charge stored at the cell node 325 is coupled through the activated selection switch 310 to create a voltage difference between the nodes 321 and 323, for example. In embodiments of the disclosure having the node 321 coupled to a digit line digit and the node 323 coupled to a digit line digit_bar, a voltage difference is created between the digit lines digit and digit_bar when the selection switch 310 is activated.

During activation of the selection switch 310, a voltage at one or both the nodes 321 and 323 may be provided to the cell node 325 (e.g., to write data to the memory cell). Deactivation of the selection switch 310 (e.g., changing the access line voltage from a high voltage level to a low voltage level) causes the voltage at one or both the nodes 321 and 323 to be stored at the cell node 325. As a result of deactivating the selection switch 310, the cell node floats at the stored voltage.

Figure 4:
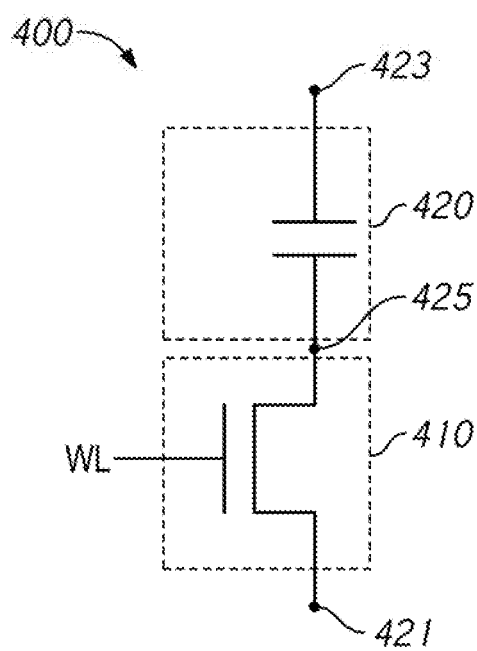
FIG. 4 is a diagram of a memory cell according to an embodiment of the disclosure.

FIG. 4 is a diagram of a memory cell 400 according to an embodiment of the disclosure. The memory cell 400 may be included in the memory cell 300 of FIG. 3, the memory cells 215 and/or 217 of FIG. 2, and/or the memory cell MC of the semiconductor device 100 of FIG. 1 in some embodiments of the disclosure.

The memory cell 400 includes a field effect transistor (FET) 410 and a dielectric capacitor 420 coupled together at a cell node 425. In some embodiments of the disclosure, the FET is an n-channel FET (nFET). The FET 410 may represent a selection switch and the dielectric capacitor 420 may represent a storage element. Nodes 421 and 423 may be coupled to respective digit lines of a pair of digit lines. The dielectric capacitor 420 includes a first plate coupled to the cell node 425 and a second plate coupled to the node 423. A dielectric material is disposed between the first and second plates of the capacitor 420.

In operation the memory cell 400 stores a voltage and/or charge at cell node 425. The stored voltage and/or charge may be coupled with the node 421 when the FET 410 is activated by activating the access line (e.g., access line voltage changes from a low voltage level to a high voltage level). The coupling of the stored voltage and/or charge with the node 421 may create a voltage difference between the nodes 421 and 423. When the FET 410 is deactivated by deactivating the access line (e.g., access line voltage changes from a high voltage level to a low voltage level), a voltage at node 421 may be stored at the cell node 425, and the cell node 425 floats at the stored voltage.

Figure 5:
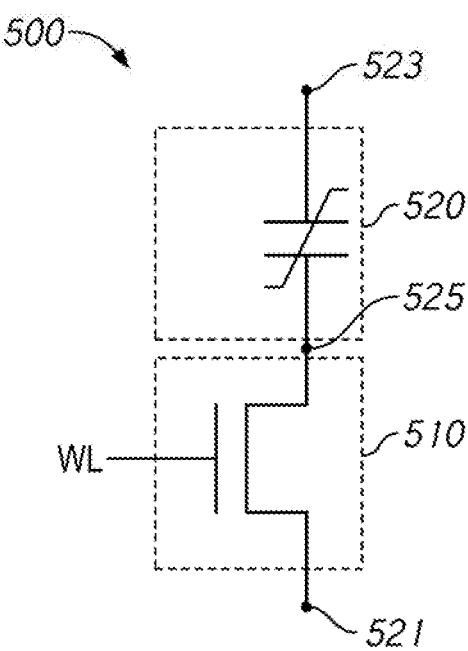
FIG. 5 is a diagram of a memory cell according to an embodiment of the disclosure.

FIG. 5 is a diagram of a memory cell 500 according to an embodiment of the disclosure. The memory cell 500 may be included in the memory cell 300 of FIG. 3, the memory cells 215 and/or 217 of FIG. 2, and/or the memory cell MC of the semiconductor device 100 of FIG. 1 in some embodiments of the disclosure.

The memory cell 500 includes a field effect transistor (FET) 510 and a ferroelectric capacitor 520 coupled together at a cell node 525. In some embodiments of the disclosure, the FET is an n-channel FET (nFET). The FET 510 may represent a selection switch and the ferroelectric capacitor 520 may represent a storage element. Nodes 521 and 523 may be coupled to respective digit lines of a pair of digit lines. The ferroelectric capacitor 520 includes a first plate coupled to the cell node 525 and a second plate coupled to the node 523. A ferroelectric material is disposed between the first and second plates of the capacitor 520.

In operation the memory cell 500 stores a voltage and/or charge at cell node 525. The stored voltage and/or charge may be coupled with the node 521 when the FET 510 is activated by activating the access line (e.g., access line voltage changes from a low voltage level to a high voltage level). The coupling of the stored voltage and/or charge with the node 521 may create a voltage difference between the nodes 521 and 523. When the FET 510 is deactivated by deactivating the access line (e.g., access line voltage changes from a high voltage level to a low voltage level), a voltage at node 521 may be stored at the cell node 525, and the cell node 525 floats at the stored voltage.

Figure 6:
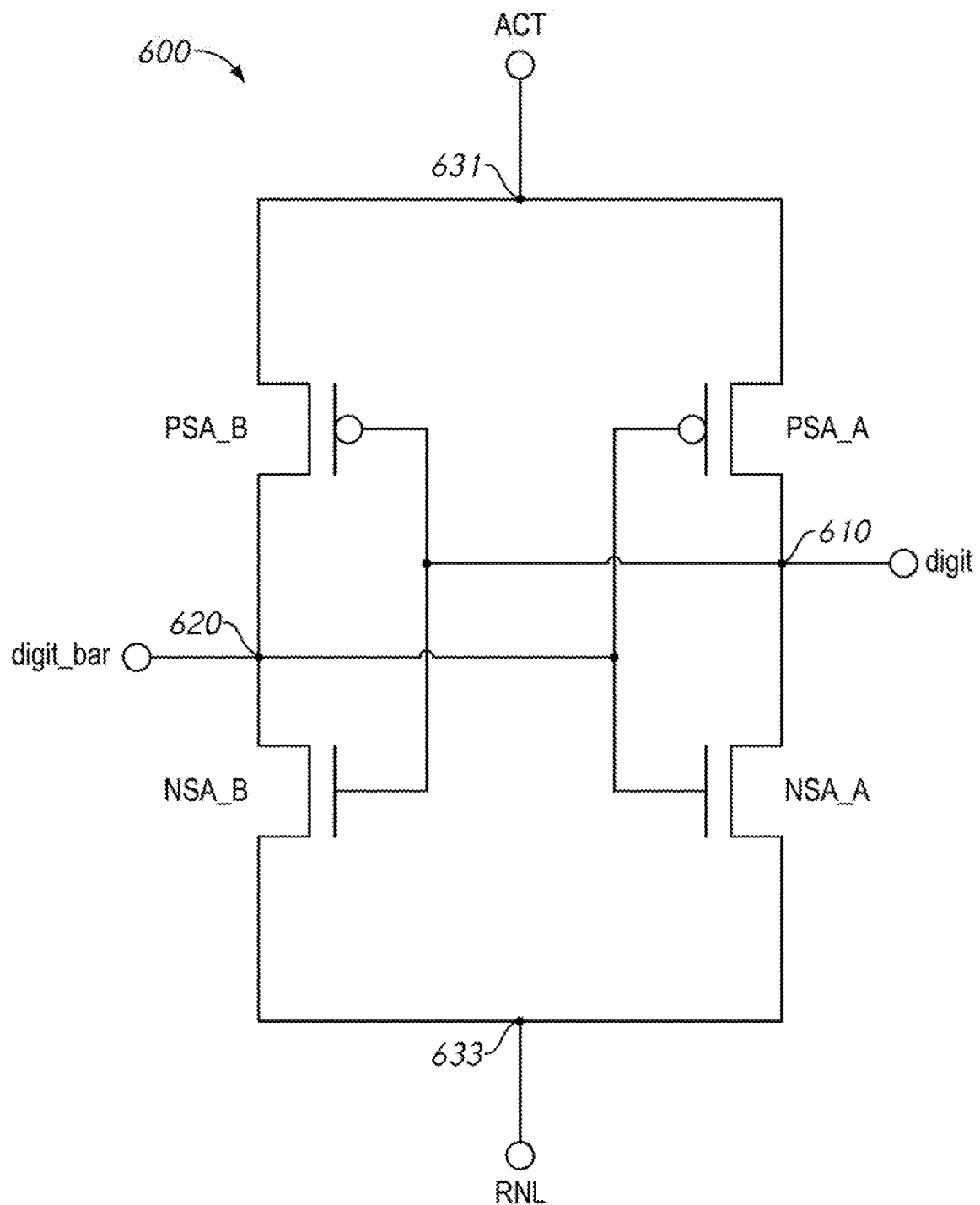
FIG. 6 is an example diagram of a sense amplifier according to an embodiment of the disclosure.

FIG. 6 is a diagram of a sense amplifier 600 according to an embodiment of the disclosure. The sense amplifier 600 may be included in the sense amplifier 210 of FIG. 2, and/or the sense amplifier SAMP of the semiconductor device 100 of FIG. 1 in some embodiments of the disclosure.

The sense amplifier 600 includes pull-up transistors PSA_A and PSA_B and pull-down transistors NSA_A and NSA_B. The pull-up transistor PSA_A and pull-down transistor NSA_A may be coupled at gut node 610, and pull-up transistor PSA_B and pull-down transistor NSA_B may be coupled at gut node 620. Gates of the pull-up transistor PSA_A and pull-down transistor NSA_A are coupled at the gut node 620, and gates of the pull-up transistor PSA_B and pull-down transistors NSA_B may be coupled at the gut node 610. The gut nodes 610 and 620 may be coupled to respective digit lines of a pair of digit lines. For example, the gut node 610 may be coupled to a digit line digit and the gut node 620 may be coupled to a digit line digit_bar. In some embodiments of the disclosure, sense amplifier gut nodes 610 and 620 may be coupled to digit lines digit and/or digit_bar through isolation switches. The isolation switches may be used to control the coupling of the gut nodes 610 and 620 to respective digit lines digit and digit_bar, for example, during operation of the sense amplifier 600. The isolation switches may be n-channel FETs (nFETs) in some embodiments of the disclosure. Power nodes 631 and 633 may be provided respective activation voltages to activate the sense amplifier 600. For example, the power node 631 may be provided an high voltage level activation voltage ACT and the power node 633 may be provide a low voltage level activation voltage RNL to activate the sense amplifier 600. In some embodiments of the disclosure, the ACT voltage is an array voltage (e.g., VARY) and the RNL voltage is ground (e.g., 0 volts).

In operation, the sense amplifier 600 may amplify a voltage difference between the gut nodes 610 and 620 when activated. For example, when the activations voltages ACT and RNL are provided to the power nodes 631 and 633, respectively, to activate the sense amplifier 600, the sense amplifier 600 may drive one of the gut nodes to one of the activation voltage and drive the other stat node to the other activation voltage.

For example, where the gut node 610 has a higher relative voltage than the gut node 620, the pull-down transistor NSA_B is activated to provide the activation voltage RNL to the gut node 620 and the pull-up transistor PSA_A is activated to provide the activation voltage ACT to the gut node 610. As a result, the gut node 610 is driven to the ACT voltage and the gut node 620 is driven to the RNL voltage. Conversely, where the gut node 620 has a higher relative voltage than the gut node 610, the pull-down transistor NSA_A is activated to provide the activation voltage RNL to the gut node 610 and the pull-up transistor PSA_B is activated to provide the activation voltage ACT to the gut node 620.

Figure 7:
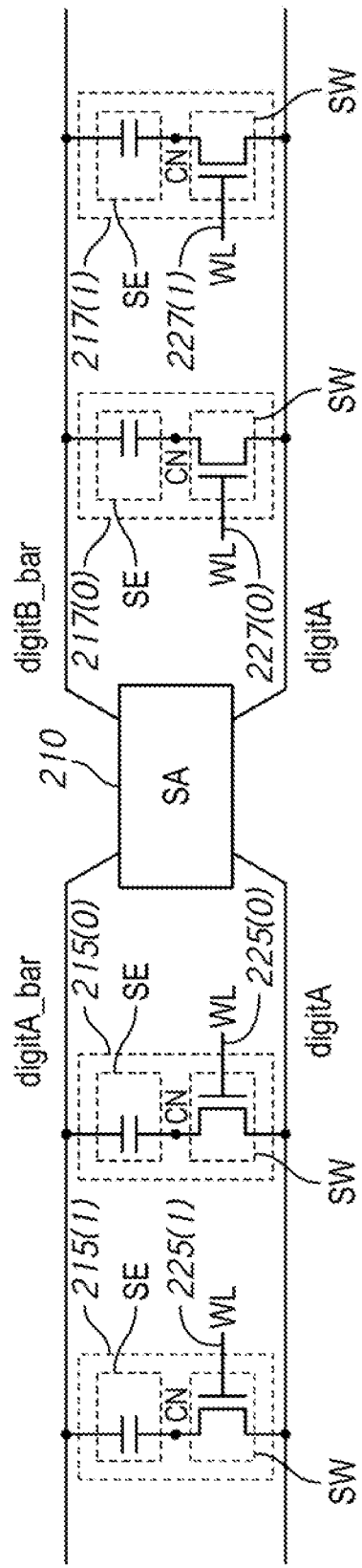
FIG. 7 is a diagram showing the portion of the memory of FIG. 2 according to an embodiment of the disclosure.

FIG. 7 is a diagram showing the portion of the memory 200 of FIG. 2, but according to an embodiment of the disclosure with memory cells 215(0) and 215(1) including field effect transistor (FET) selection switches SW and capacitor storage elements. Operation of the portion of memory 200 as shown in FIG. 7 will be described with reference to FIGS. 8-11. FIGS. 8-11 are diagrams showing various voltages during operation according to an embodiment of the disclosure. The operations according to FIGS. 8-11 are not limited to the specific embodiment of the portion of memory 200 as shown in FIG. 7, and may be applied to other embodiments of the disclosure.

Figure 8:
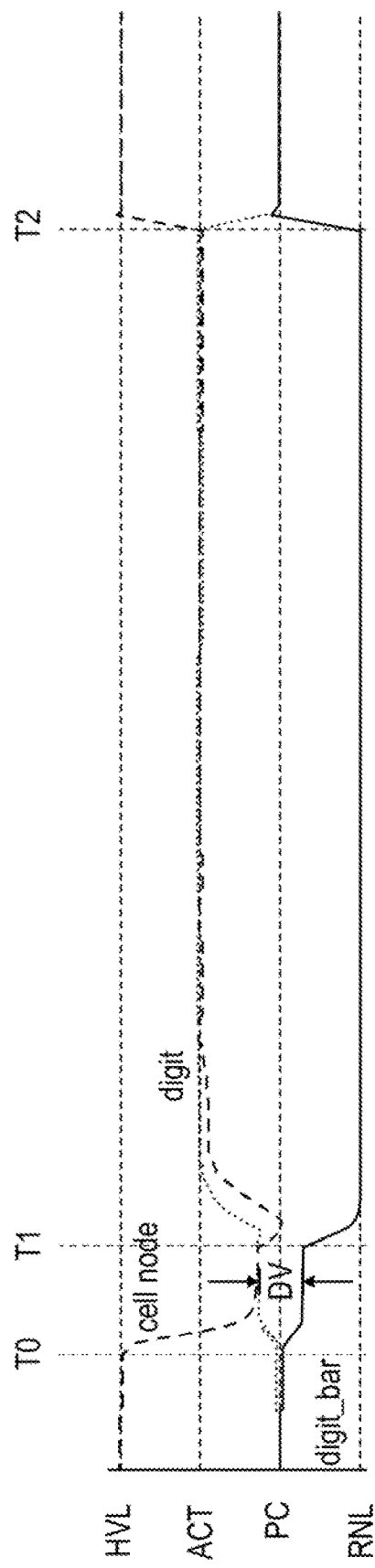
FIG. 8 is a diagram showing various voltages during operation of a memory cell, digit lines, and sense amplifier according to an embodiment of the disclosure.

FIG. 8 is a diagram showing various voltages during operation of the memory cell 215(0), digit lines, and the sense amplifier 210 of FIG. 7 according to an embodiment of the disclosure. In the example operation of FIG. 8, the memory cell 215(0) stores a high voltage level (HVL) at cell node CN. The HVL voltage stored by the memory cell 215(0) may, in some embodiments of the disclosure, represent a "1" bit of data.

In the example operation of FIG. 8, the HVL voltage is greater than the activation voltage ACT. However, in some embodiments of the disclosure, the HVL voltage may be the same as the ACT voltage.

Prior to time T0, access line WL 225(0) is deactivated (e.g., a low access line voltage level). As a result, the selection switch SW of the memory cell 215(0) is deactivated and cell node CN of the memory cell 215(0) stores a HVL voltage. The digit lines digit and digit_bar are both at a precharge voltage PC.

Following time T0, the access line WL 225(0) is activated (e.g., a high access line voltage level) (not shown in FIG. 8), which activates the selection switch SW of the memory cell 215(0). As a result, the HVL voltage stored by the cell node CN is coupled to the digit line digit, causing the voltage of the digit line digit to increase from the PC voltage and the cell node CN to decrease from the HVL voltage. The decrease in the voltage of the cell node CN in response to the HVL voltage being coupled to the digit line digit through the activated selection switch SW, is capacitively coupled across the storage element SE to cause the voltage of the digit line digit_bar to decrease from the PC voltage. Thus, with the voltages of the digit lines digit and digit_bar changing in response to activation of the selection switch SW, a voltage difference DV is created between the digit lines digit and digit_bar following time T0.

Following time T1, the sense amplifier 210 is activated, for example, by providing the activation voltage ACT and the activation voltage RNL (not shown in FIG. 8) to the sense amplifier 210. The activated sense amplifier 210 amplifies the voltage difference between the digit lines digit and digit_bar. In the present example with the digit line digit at a relatively higher voltage than the digit line digit_bar, the activated sense amplifier 210 drives the digit line digit to the voltage of the activation voltage ACT and drives the digit line digit_bar to the voltage of the activation voltage RNL. The voltage of the digit line digit (e.g., ACT voltage) is also provided to the cell node CN through the activated selection switch SW. After the digit lines digit and digit_bar are driven to opposite voltage levels, the voltages of the digit lines digit and digit_bar may be provided to input/output lines of a data path, for example, to be provided externally as read data.

Prior to time T2, the access line WL 225(0) is deactivated (e.g., a low access line voltage level), which deactivates the selection switch SW of the memory cell 215(0). As a result, the cell node CN is floating at the ACT voltage.

Following time T2, the digit lines digit and digit_bar are precharged and/or equalized to the precharge voltage PC. As a result, in the example operation of FIG. 8, the digit line digit is driven down from the ACT voltage to the precharge voltage PC and the digit line digit_bar is driven up from the RNL voltage to the precharge voltage PC. The voltage increase of the digit line digit_bar driven from the RNL voltage to the precharge voltage PC is capacitively coupled across the storage element SE to increase the voltage of the floating cell node CN from the ACT voltage to the HVL voltage. In some embodiments of the disclosure, for example, as shown for the example operation of FIG. 8, the voltage increase of the cell node of the CN of the memory cell 215(0) is the same as the voltage increase of the digit line digit_bar from the RNL voltage to the precharge voltage following precharge.

The voltage of the cell node CN following time T2 is the same HVL voltage of the cell node CN prior to time T0, before the memory cell 215(0) was accessed. Thus, following access of the memory cell 215(0), the cell node CN is restored to the same voltage level as before access.

The voltage difference DV between digit lines digit and digit_bar resulting from the coupling of the stored voltage and/or charge of the cell node CN to the digit line digit (e.g., between times T0 and T1), may be greater than a voltage difference for a conventional arrangement. For example, an arrangement having the memory cell 215 coupled to one of the digit lines may provide a voltage difference DV that is less than for an arrangement according an embodiment of the disclosure with the memory cell 215 coupled to both digit lines of a digit line pair. The larger voltage difference DV may provide more consistent and accurate amplification by the sense amplifier 210.

Figure 9:
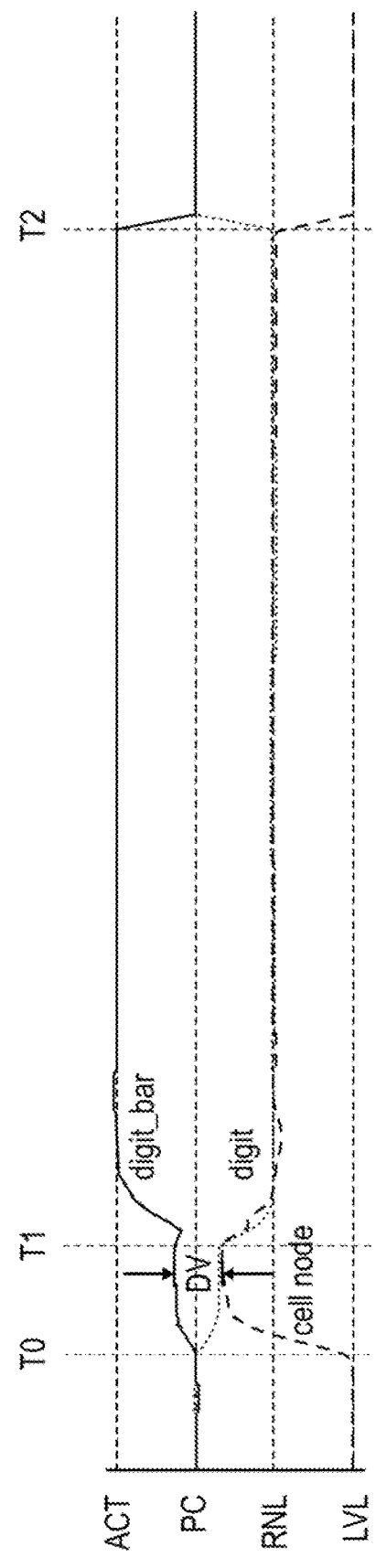
FIG. 9 is a diagram showing various voltages during operation of the memory cell, digit lines, and sense amplifier according to an embodiment of the disclosure.

FIG. 9 is a diagram showing various voltages during operation of the memory cell 215(0), digit lines, and the sense amplifier 210 of FIG. 7 according to an embodiment of the disclosure. In the example operation of FIG. 9, the memory cell 215(0) stores a low voltage level (LVL) at cell node CN. The LVL voltage stored by the memory cell 215(0) may, in some embodiments of the disclosure, represent a "0" bit of data.

In the example operation of FIG. 9, the LVL voltage is less than the activation voltage RNL. However, in some embodiments of the disclosure, the LVL voltage may be the same as the RNL voltage.

Prior to time T0, access line WL 225(0) is deactivated (e.g., a low access line voltage level). As a result, the selection switch SW of the memory cell 215(0) is deactivated and cell node CN of the memory cell 215(0) stores a LVL voltage. The digit lines digit and digit_bar are both at a precharge voltage PC.

Following time T0, the access line WL 225(0) is activated (e.g., a high access line voltage level) (not shown in FIG. 9), which activates the selection switch SW of the memory cell 215(0). As a result, the LVL voltage stored by the cell node CN is coupled to the digit line digit, causing the voltage of the digit line digit to decrease from the PC voltage and the cell node CN to increase from the LVL voltage. The increase in the voltage of the cell node CN in response to the LVL voltage being coupled to the digit line digit through the activated selection switch SW, is capacitively coupled across the storage element SE to cause the voltage of the digit line digit_bar to increase from the PC voltage. Thus, with the voltages of the digit lines digit and digit_bar changing in response to activation of the selection switch SW, a voltage difference DV is created between the digit lines digit and digit_bar following time T0.

Following time T1, the sense amplifier 210 is activated, for example, by providing the activation voltage ACT and the activation voltage RNL (not shown in FIG. 9) to the sense amplifier 210. The activated sense amplifier 210 amplifies the voltage difference between the digit lines digit and digit_bar. In the present example, with the digit line digit at a relatively lower voltage than the digit line digit_bar, the activated sense amplifier 210 drives the digit line digit to the voltage of the activation voltage RNL and drives the digit line digit_bar to the voltage of the activation voltage ACT. The voltage of the digit line digit (e.g., RNL voltage) is also provided to the cell node CN through the activated selection switch SW. After the digit lines digit and digit_bar are driven to opposite voltage levels, the voltages of the digit lines digit and digit_bar may be provided to input/output lines of a data path, for example, to be provided externally as read data.

Prior to time T2, the access line WL 225(0) is deactivated (e.g., a low access line voltage level), which deactivates the selection switch SW of the memory cell 215(0). As a result, the cell node CN is floating at the RNL voltage.

Following time T2, the digit lines digit and digit_bar are precharged and/or equalized to the precharge voltage PC. As a result, in the example operation of FIG. 9, the digit line digit is driven up from the RNL voltage to the precharge voltage PC and the digit line digit_bar is driven down from the ACT voltage to the precharge voltage PC. The voltage decrease of the digit line digit_bar driven from the ACT voltage to the precharge voltage PC is capacitively coupled across the storage element SE to decrease the voltage of the floating cell node CN from the RNL voltage to the LVL voltage. In some embodiments of the disclosure, for example, as shown for the example operation of FIG. 9, the voltage decrease of the cell node of the CN of the memory cell 215(0) is the same as the voltage decrease of the digit line digit_bar from the ACT voltage to the precharge voltage following precharge.

The voltage of the cell node CN following time T2 is the same LVL voltage of the cell node CN prior to time T0, before the memory cell 215(0) was accessed. Thus, following access of the memory cell 215(0), the cell node CN is restored to the same voltage level as before access.

As previously described with reference to FIG. 8, for an arrangement according an embodiment of the disclosure with the memory cell 215 coupled to both digit lines of a digit line pair, the voltage difference DV between digit lines digit and digit_bar resulting from the coupling of the stored voltage and/or charge of the cell node CN to the digit line digit (e.g., between times T0 and T1), may be greater than a voltage difference for a conventional arrangement. The larger voltage difference DV may provide more consistent and accurate sensing and amplification by the sense amplifier 210.

Figure 10:
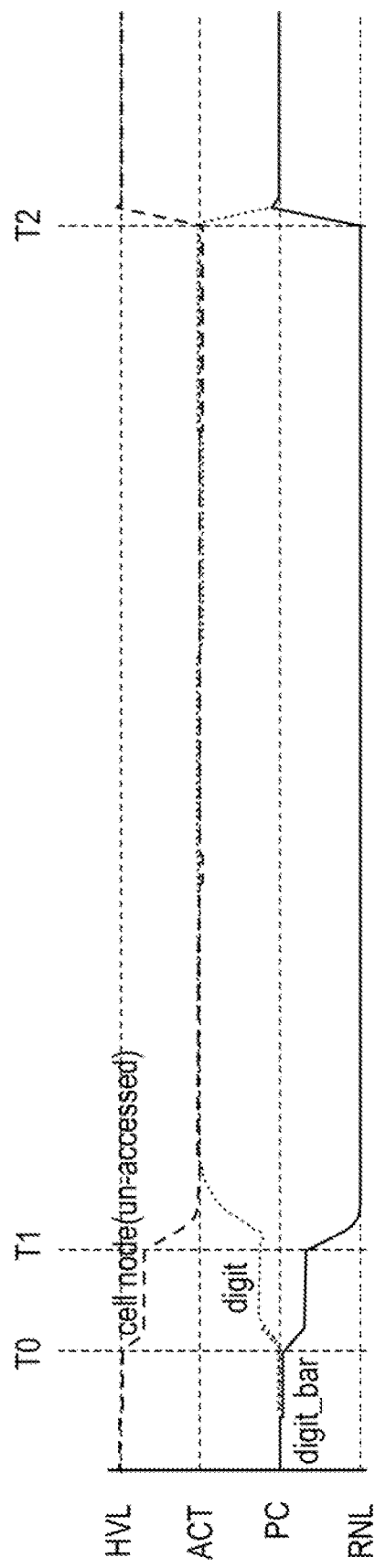
FIG. 10 is a diagram showing a cell node voltage of an un-accessed memory cell during an access operation of an accessed memory cell according to an embodiment of the disclosure.

FIG. 10 is a diagram showing a cell node voltage of an un-accessed memory cell 215(1) during an access operation of an accessed memory cell 215(0) of FIG. 7 according to an embodiment of the disclosure. In the example operation of FIG. 10, the un-accessed memory cell 215(1) stores a high voltage level (HVL) at its cell node CN and the accessed memory cell 215(0) stores a HVL voltage at its cell node CN.

In the example operation of FIG. 10, the HVL voltage is greater than the activation voltage ACT. However, in some embodiments of the disclosure, the HVL voltage may be the same as the ACT voltage.

Prior to time T0, the un-accessed memory cell stores a HVL voltage at its cell node CN. The digit lines digit and digit_bar are both at a precharge voltage PC.

Following time T0, the accessed memory cell 215(0) is accessed by activating the access line WL 225(0) (e.g., a high access line voltage level) (not shown in FIG. 10). The access line WL 225(1) of the un-accessed memory cell 215(1) remains inactive (e.g., a low access line voltage level) because the memory cell 215(1) is not being accessed.

As a result of activating the access line WL 225(0), the HVL voltage stored by the cell node CN of the accessed memory cell 215(0) is coupled to the digit line digit, causing the voltage of the digit line digit to increase from the PC voltage. Additionally, the decrease in the voltage of the cell node CN of the accessed memory cell 215(0) is capacitively coupled across the storage element SE of the accessed memory cell 215(0) to cause the voltage of the digit line digit_bar to decrease from the PC voltage.

The voltage decrease of the digit, line digit_bar is capacitively coupled across the storage element SE of the un-accessed memory cell 215(1) to cause the voltage of the cell node CN of the on-accessed memory cell 215(1) to decrease.

Following time T1, the sense amplifier 210 is activated (e.g., by providing the activation voltage ACT and the activation voltage RNL), and amplifies the voltage difference between the digit lines digit and digit_bar. In the example operation of FIG. 10, with the digit line digit at a relatively higher voltage than the digit line digit_bar, the activated sense amplifier 210 drives the digit line digit to the voltage of the activation voltage ACT and drives the digit line digit_bar to the voltage of the activation voltage RNL.

The voltage decrease of the digit line digit_bar to the RNL voltage is coupled across the storage element SE of the un-accessed memory cell 215(1) to cause the voltage of the cell node CN of the un-accessed memory cell 215(1) to further decrease.

In some embodiments of the disclosure, for example, as shown for the example operation of FIG. 10, the total voltage decrease of the cell node of the CN of the un-accessed memory cell 215(1) from the HVL voltage is the same as the voltage decrease of the digit line digit_bar from the precharge voltage to the RNL voltage.

Prior to time T2, the access line WL 225(0) is deactivated (e.g., a low access line voltage level), which deactivates the selection switch SW of the accessed memory cell 215(0) to store the voltage of the digit line digit at the cell node CN of the access memory cell 215(0).

Following time T2, the digit lines digit and digit_bar are precharged and/or equalized to the precharge voltage PC. As a result, in the example operation of FIG. 10, the digit line digit is driven down from the ACT voltage to the precharge voltage PC and the digit line digit_bar is driven up from the RNL voltage to the precharge voltage PC.

The voltage increase of the digit line digit_bar driven from the RNL voltage to the precharge voltage PC is capacitively coupled across the storage element SE of the un-accessed memory cell 215(1) to increase the voltage of the floating cell node CN of the un-accessed memory cell 215(1) to the HVL voltage. In some embodiments of the disclosure, for example, as shown for the example operation of FIG. 10, the voltage increase of the cell node of the CN of the un-accessed memory cell 215(1) following precharge is the same as the voltage increase of the digit line digit_bar from the RNL voltage to the precharge voltage.

The voltage of the cell node CN of the un-accessed memory cell 215(1) following time T2 is the same HVL voltage of the cell node CN of the un-accessed memory cell 215(1) prior to time T0 (e.g., before the accessed memory cell 215(0) was accessed). Thus, following access of the accessed memory cell 215(0), the cell node CN of the un-accessed memory cell 215(1) is restored to the same voltage level as before the access operation.

Figure 11:
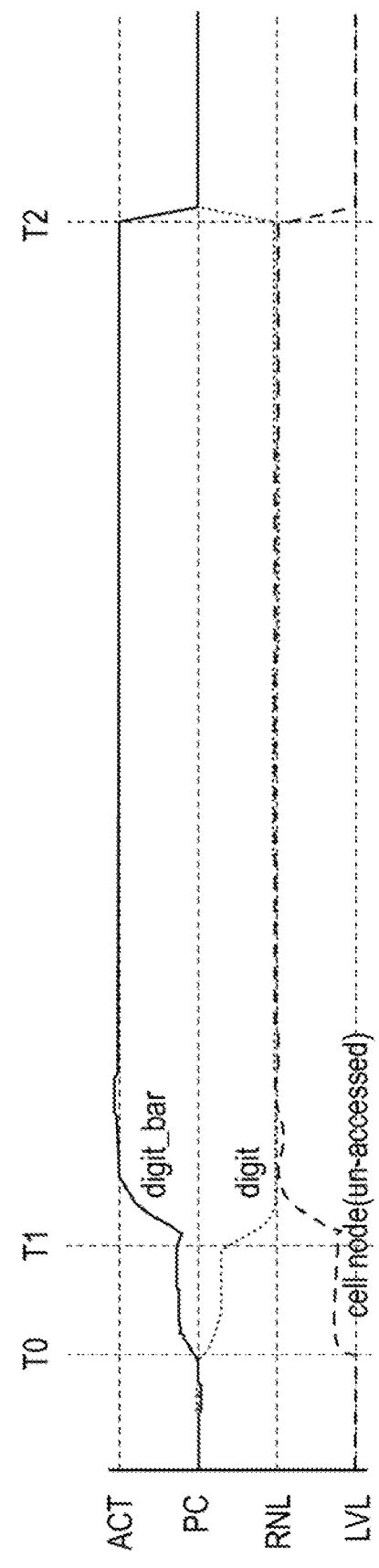
FIG. 11 is a diagram showing a cell node voltage of an un-accessed memory cell during an access operation of an accessed memory cell according to an embodiment of the disclosure.

FIG. 11 is a diagram showing a cell node voltage of an un-accessed memory cell 215(1) during an access operation of an accessed memory cell 215(0) of FIG. 7 according to an embodiment of the disclosure. In the example operation of FIG. 11, the un-accessed memory cell 215(1) stores a low voltage level (LVL) at its cell node CN and the accessed memory cell 215(0) stores a LVL voltage at its cell node CN.

In the example operation of FIG. 11, the LVL voltage is less than the activation voltage RNL. However, in some embodiments of the disclosure, the LVL voltage may be the same as the RNL voltage.

Prior to time T0, the un-accessed memory cell stores a LVL voltage at its cell node CN. The digit lines digit and digit_bar are both at a precharge voltage PC.

Following time T0, the accessed memory cell 215(0) is accessed by activating the access line WL 225(0) (e.g., a high access line voltage level) (not shown in FIG. 11). The access line WL 225(1) of the un-accessed memory cell 215(1) remains inactive (e.g., a low access line voltage level) because the memory cell 215(1) is not being accessed.

As a result of activating the access line WL 225(0), the LVL voltage stored by the cell node CN of the accessed memory cell 215(0) is coupled to the digit line digit, causing the voltage of the digit line digit to decrease from the PC voltage. Additionally, the increase in the voltage of the cell node CN of the accessed memory cell 215(0) is capacitively coupled across the storage element SE of the accessed memory cell 215(0) to cause the voltage of the digit line digit_bar to increase from the PC voltage.

The voltage increase of the digit line digit_bar is capacitively coupled across the storage element SE of the un accessed memory cell 215(1) to cause the voltage of the cell node CN of the un-accessed memory cell 215(1) to increase.

Following time T1, the sense amplifier 210 is activated (e.g., by providing the activation voltage ACT and the activation voltage RNL), and amplifies the voltage difference between the digit lines digit and digit_bar. In the example operation of FIG. 11, with the digit line digit at a relatively lower voltage than the digit line digit_bar, the activated sense amplifier 210 drives the digit line digit to the voltage of the activation voltage RNL and drives the digit line digit_bar to the voltage of the activation voltage ACT.

The voltage increase of the digit line digit_bar to the ACT voltage is coupled across the storage element SE of the un-accessed memory cell 215(1) to cause the voltage of the cell node CN of the un-accessed memory cell 215(1) to further increase.

In some embodiments of the disclosure, for example, as shown for the example operation of FIG. 11, the total voltage increase of the cell node of the CN of the un-accessed memory cell 215(1) from the LVL voltage is the same as the voltage increase of the digit line digit_bar from the precharge voltage to the ACT voltage.

Prior to time T2, the access line WL 225(0) is deactivated (e.g., a low access line voltage level), which deactivates the selection switch SW of the accessed memory cell 215(0) to store the voltage of the digit line digit at the cell node CN of the accessed memory cell 215(0).

Following time T2, the digit lines digit and digit_bar are precharged and/or equalized to the precharge voltage PC. As a result, in the example operation of FIG. 11, the digit line digit is driven up from the RNL voltage to the precharge voltage PC and the digit line digit_bar is driven down from the ACT voltage to the precharge voltage PC.

The voltage decrease of the digit line digit_bar driven from the ACT voltage to the precharge voltage PC is capacitively coupled across the storage element SE of the un-accessed memory cell 215(1) to decrease the voltage of the floating cell node CN of the un-accessed memory cell 215(1) to the LVL voltage. In some embodiments of the disclosure, for example, as shown for the example operation of FIG. 11, the voltage decrease of the cell node of the CN of the un-accessed memory cell 215(1) following precharge is the same as the voltage decrease of the digit line digit_bar from the ACT voltage to the precharge voltage.

The voltage of the cell node CN of the tin-accessed memory cell 215(1) following time T2 is the same LVL voltage of the cell node CN of the un-accessed memory cell 215(1) prior to time T0 (e.g., before the accessed memory cell 215(0) was accessed). Thus, following access of the accessed memory cell 215(0), the cell node CN of the un-accessed memory cell 215(1) is restored to the same voltage level as before the access operation.

In an example operation according to an embodiment of the disclosure where the un-accessed memory cell 215(1) stores a high voltage level (HVL) at its cell node CN and the accessed memory cell 215(0) stores a low voltage level (LVL) voltage at its cell node CN, the cell node CN voltage of the un-accessed memory cell 215(1) increases from the HVL voltage as the accessed memory cell 215(0) is accessed and the sense amplifier is activated (e.g., the digit line digit_bar is driven to the ACT voltage), and then decreases to the HVL voltage when the digit lines digit and digit_bar are precharged to the precharge voltage PC following deactivation of the accessed memory cell 215(0). As a result, the voltage of the cell node CN of the un-accessed memory 215(1) following the access operation of the accessed memory cell 215(0) is the same as the voltage before the access operation.

In an example operation according to an embodiment of the disclosure where the un-accessed memory cell 215(1) stores a low voltage level (LVL) at its cell node CN and the accessed memory cell 215(0) stores a high voltage level (HVL) voltage at its cell node CN, the cell node CN voltage of the un-accessed memory cell 215(1) decreases from the LVL voltage as the accessed memory cell 215(0) is accessed and the sense amplifier is activated (e.g., the digit line digit_bar is driven to the RNL voltage), and then increases to the LVL voltage when the digit lines digit and digit_bar are precharged to the precharge voltage PC following deactivation of the accessed memory cell 215(0). As a result, the voltage of the cell node CN of the un-accessed memory 215(1) following the access operation of the accessed memory cell 215(0) is the same as the voltage before the access operation.

Figure 12:
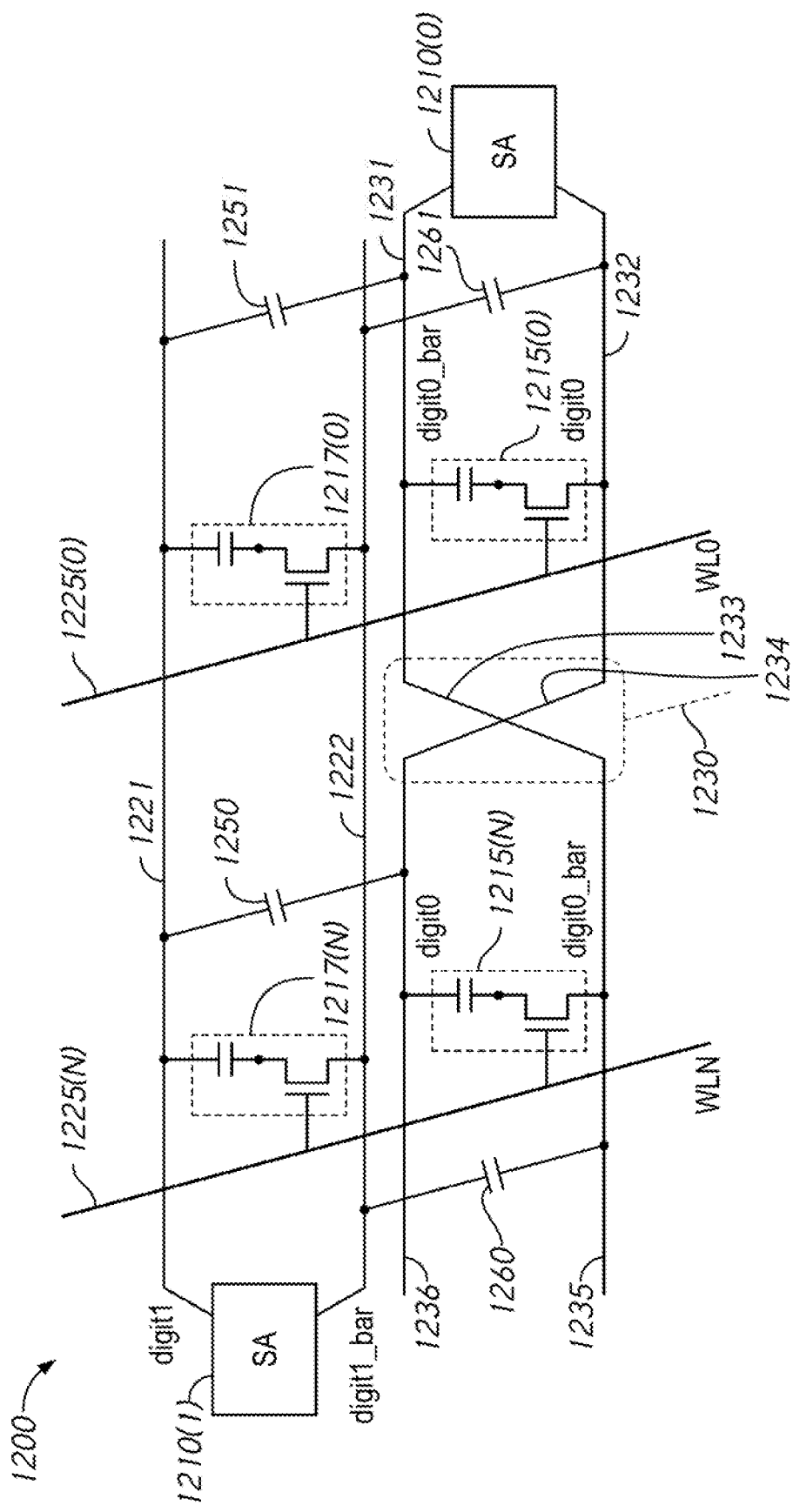
FIG. 12 is a diagram of a portion of a memory that includes sense amplifiers and memory cells coupled to pairs of digit lines according to an embodiment of the disclosure.

FIG. 12 is a diagram of a portion of a memory 1200 that includes sense amplifiers and memory cells coupled to pairs of digit lines according to an embodiment of the disclosure. The portion of memory 1200 may be included in the semiconductor device 100 in some embodiments of the disclosure.

A sense amplifier 1210(0) is coupled to a pair of digit lines digit0 and digit0_bar and a sense amplifier 1210(1) is coupled to a pair of digit lines digit1 and digit1_bar. Memory cells 1215(0)-1215(N) are coupled to both the digit lines digit0 and digit0_bar. Memory cells 1217(0)-1217(N) are coupled to both die digit lines digit1 and digit1_bar. The memory cells 1215(0) and 1217(0) are coupled to access line WL0 1225(0) and the memory cells 1215(N) and 1217(N) are coupled to access line WLN 1225(N). Although not shown in FIG. 12, the sense amplifiers 1210 may be coupled to an additional digit line pair that extends in a direction opposite of the digit lines shown in FIG. 12. For example, the sense amplifier 1210(0) may be coupled to an additional digit line pair that extends to the right of the sense amplifier 1210(0), and the sense amplifier 1210(1) may be coupled to an additional digit line pair that extends to the left of the sense amplifier 1210(1).

FIG. 12 illustrates two memory cells 1215(0) and 1215(N) coupled to the digit lines digit0 and digit0_bar, and two memory cells 1217(0) and 1217(N) coupled to the digit lines digit1 and digit1_bar. However, additional memory cells may be coupled to the digit lines digit0 and digit0_bar, and coupled to the digit lines digit1 and digit1_bar. Additionally, additional access lines and rows of memory cells coupled to respective access lines may be included without departing from the scope of the disclosure.

The sense amplifiers may include the sense amplifier 600 of FIG. 6 in some embodiments of the disclosure. Other sense amplifiers that amplify a voltage difference between the respective digit lines of a digit line pair may be used in other embodiments of the disclosure.

The memory cells 1215 and 1217 are shown in FIG. 12 as including a capacitor storage element and a field effect transistor (FET) selection switch. The capacitor storage element may be a dielectric capacitor, ferroelectric capacitor, or other capacitor. In some embodiments of the disclosure, the memory cells 1215 and 1217 may include additional and/or alternative components. Embodiments of the disclosure are not limited to the particular memory cells shown for memory cells 1215 and 1217 in FIG. 12, and other examples of memory cells may be included.

The memory cells, digit lines, and sense amplifiers of the portion of memory 1200 may be operated as previously described with reference to FIGS. 8-11, in some embodiments of the disclosure. The memory cells, digit lines, and sense amplifiers of the portion of memory 1200 may be operated in modified and/or alternative manners in other embodiments of the disclosure.

The digit line digit0_bar includes digit line portions 1231, 1233, and 1235, and the digit line digit0 includes digit line portions 1232, 1234, and 1236. The digit line portions of the respective digit lines are coupled together to provide a continuously conductive digit line. The digit line portions 1233 and 1234 provide a "twist" in the digit lines, and are included in a digit line "twist" region 1230. The digit line digit1 included digit line 1221 and the digit line digit1_bar includes digit lines 1222. In some embodiments of the disclosure, the digit lines digit1 and digit1_bar do not include a digit line twist (e.g., as shown in the embodiment of FIG. 12). However, embodiments of the disclosure are not limited to arrangements including digit lines digit1 and digit1_bar without a digit line twist. In some embodiments of the disclosure, a pair of digit lines (e.g., digit lines digit0 and digit0_bar) may include multiple digit line twists. In some embodiments of the disclosure, the digit lines digit1 and digit1_bar include one or more digit line twists in twist regions that are displaced relative to the twist regions 1230 of the adjacent digit lines digit0 and digit0_bar.

In some embodiments of the disclosure including memory cells 1215 including a storage element and a selection switch, some of the memory cells 1215 have the selection switch coupled to digit line digit0 to couple the cell node to the digit line digit0 when activated and have the storage element coupled between the cell node and the digit line digit0_bar (e.g., memory cell 1215(0)). In contrast, some of the memory cells 1215 have the selection switch coupled to digit line digit0_bar to couple the cell node to the digit line digit0_bar when activated and have the storage element coupled between the cell node and the digit line digit0 (e.g., memory cell 1215(N)). In embodiments of the disclosure including adjacent digit lines digit1 and digit1_bar without a digit line twist, and further include memory cells 1217(0)-1217(N) having a storage element and a selection switch, the selection switches of the memory cells are coupled to the same digit line (e.g., digit line digit1_bar) and the storage elements are coupled between the respective cell nodes and the same digit line (e.g., digit line digit1).

As previously described, the digit line portions 1233 and 1234 provide a twist in the digit lines in the digit line "twist" region 1230. The digit line, portions 1233 and 1234 cross to change the physical arrangement of the digit line portions of digit line digit0 and the digit line portions of digit line digit0_bar. For example, the digit line portion 1236 of the digit line digit0 is longitudinally aligned with the digit line portion 1231 of the digit line digit0_bar, and the digit line portion 1235 of the digit line digit0_bar is longitudinally aligned with the digit line portion 1232 of the digit line digit0. Longitudinally aligned may mean the digit line portions are generally physically aligned along the respective lengths of the digit line portions to a common axis as the digit line portions extend longitudinally. In contrast, in some embodiments of the disclosure including digit lines digit1 and digit1_bar without any digit line twist (e.g., as shown in the embodiment of FIG. 12), each of the digit lines digit1 and digit1_bar extend longitudinally their entire lengths without any change in alignment.

In some embodiments of the disclosure, the digit lines digit0 and digit0_bar may be arranged in a planar manner, with the digit lines digit0 and digit0_bar laterally displaced from one another in a common horizontally oriented plane. In some embodiments of the disclosure, the digit lines digit0 and digit0_bar may be arranged in a vertical manner, with the digit lines digit0 and digit0_bar vertically displaced from one another in a common vertically oriented plane. The digit lines digit1 and digit1_bar may be similarly arranged in a planar manner or in a vertical manner as the digit lines digit0 and digit0_bar in some embodiments of the disclosure. For example, in an embodiment of the disclosure including digit lines digit0 and digit0_bar, and digit1 and digit1_bar in a vertical arrangement, the digit lines digit0 and digit0_bar are vertically displaced relative to one another, and the digit lines digit1 and digit1_bar are vertically displaced relative to one another. The digit lines digit0 and digit0_bar are displaced laterally relative to the digit lines digit1 and digit1_bar. In an embodiment of the disclosure including digit lines digit0 and digit0_bar, and digit1 and digit1_bar in a planar arrangement, the digit lines digit0 and digit0_bar are laterally displaced relative to one another, and the digit lines digit1 and digit1_bar are laterally displaced relative to one another. The digit lines digit0 and digit0_bar are displaced laterally relative to the digit lines digit1 and digit1_bar.

The twist included in the digit line pair of digit0 and digit0_bar may provide improved sensing margin by reducing digit line coupling noise. The twist included in digit line pair digit0 and digit0_bar changes the proximity of the digit line portions of the digit lines digit0 and digit0_bar to physically adjacent digit lines, for example, of digit lines digit1 and digit1_bar. As known, signal lines may be affected by voltage transitions on physically adjacent signal lines. For example, voltage transitions on the digit lines digit1 and digit1_bar during operation (e.g., an access operation) can affect the digit line portion of the digit lines digit0 and digit0_bar that is physically adjacent the respective digit line digit1 and digit1_bar. The voltage transitions may be capacitively coupled through parasitic capacitances to adjacent digit lines to create digit line coupling noise. Examples of parasitic capacitances 1250, 1251, 1260, and 1261 between the digit lines digit0, digit0_bar, digit1, digit1_bar are shown in FIG. 12.

In an embodiment having the digit lines digit0, digit0_bar, digit1, digit1_bar vertically arranged, and with the digit lines digit0 and digit0_bar, and digit1 and digit1_bar laterally displaced relative to one another, the digit line digit1 may be capacitively coupled through parasitic capacitance 1251 to digit line portion 1231 of digit line digit0_bar and also capacitively coupled through parasitic capacitance 1250 to digit line portion 1236 of digit line digit0. The digit line digit1_bar may be capacitively coupled through parasitic capacitance 1261 to digit line portion 1232 of digit line digit0 and also capacitively coupled through parasitic capacitance 1260 to digit line portion 1235 of digit line digit0_bar. As a result, voltage transitions on digit line digit1 will affect both digit lines digit0 and digit0_bar, and voltage transitions on digit line digit1_bar will affect both digit lines digit0 and digit0_bar. By providing digit line coupling noise to both digit lines digit0 and digit0_bar, the digit line coupling noise may be cancelled out by the sense amplifier 1210(0) during sensing of the voltages of digit lines digit0 and digit0_bar.

The arrangement of the memory cells, digit lines, and sense amplifiers of the portion of memory 1200 of FIG. 12 may be expanded to provide several adjacent memory cells, digit lines, and sense amplifiers, for example, to be included in a memory array.

Figure 13:
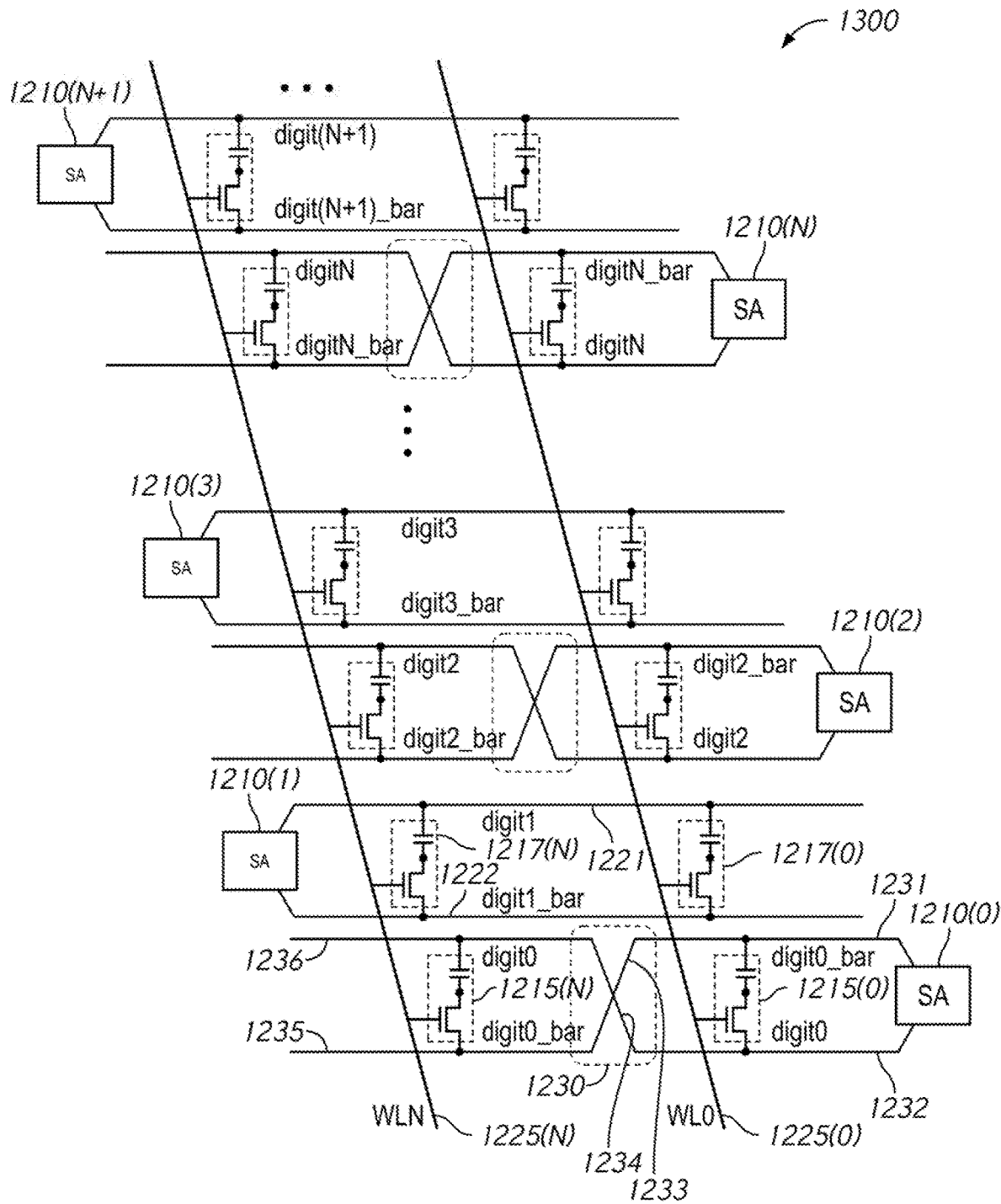
FIG. 13 is a diagram of a portion of a memory that includes sense amplifiers and memory cells coupled to pairs of digit lines according to an embodiment of the disclosure.

FIG. 13 is a diagram of a portion of a memory 1300 that includes sense amplifiers and memory cells coupled to pairs of digit lines according to an embodiment of the disclosure. The portion of memory 1300 may be included in the semiconductor device 100 in some embodiments of the disclosure.

The memory cells 1215 and 1217, digit lines digit0, digit0_bar, digit1, and digit1_bar, and sense amplifiers 1210 of FIG. 12 are shown in FIG. 13. Additional memory cells, digit lines, and sense amplifiers are also shown. Access lines 1225(0) through 1225(N) are also shown, coupled to corresponding memory cells of the additional memory cells. When an access line is activated (e.g., a high access line voltage level), the memory cells coupled to the access line are activated for access, as previously described.

The arrangement shown in FIG. 13 includes digit lines with every other digit line pair having a digit line twist. A digit line pair without a digit line twist is disposed between two digit line pairs including digit line twists. For example, digit lines digit0 and digit0_bar, digit2 and digit2_bar, digitN and digitN_bar include a digit line twist, and digit lines digit1 and digit1_bar, digit3 and digit3_bar, and digit (N+1) and digit(N+1)_bar do not include a digit line twist.

As previously described, including digit line pairs having digit line twists (e.g., digit lines digit0 and digit0_bar, digit2 and digit2_bar, digitN and digitN_bar) and memory cells associated with each of the digit line pairs coupled to both digit lines of the respective pair of digit lines may provide improved sensing margin by reducing the effect of digit line coupling noise.

Figure 14:
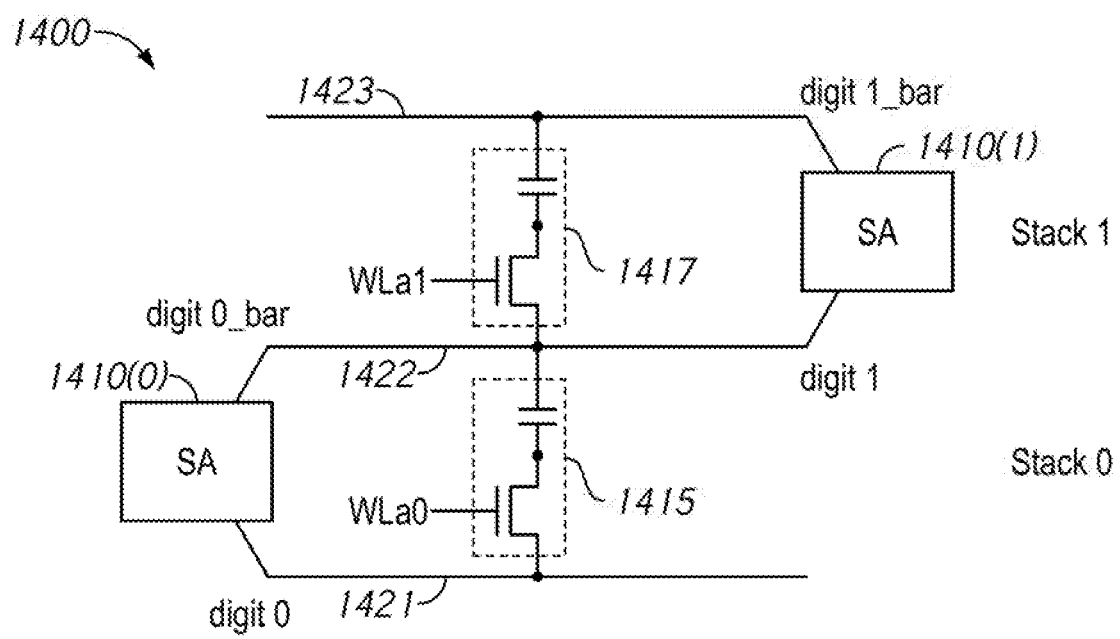
FIG. 14 is a diagram of a portion of a memory that includes sense amplifiers and memory cells coupled to pairs of digit lines according to an embodiment of the disclosure.

FIG. 14 is a diagram of a portion of a memory 1400 that includes sense amplifiers and memory cells coupled to pairs of digit lines according to an embodiment of the disclosure. The portion of memory 1400 may be included in the semiconductor device 100 in some embodiments of the disclosure.

A sense amplifier 1410(0) is coupled to digit lines 1421 and 1422 and sense amplifier 1410(1) is coupled to a pair of digit lines 1422 and 1423. Memory cell 1415 is coupled to the digit lines 1421 and 1422, and is also coupled to access line WLa0. The memory cell 1417 is coupled to the digit lines 1422 and 1423, and is also coupled to access line WLa1. The digit lines 1421 and 1422 may represent digit lines digit0 and digit0_bar associated with sense amplifier 1410(0), and the digit lines 1422 and 1423 may represent digit lines digit1 and digit1_bar associated with sense amplifier 1410(1).

Although not shown in FIG. 14, the sense amplifiers 1210 may be coupled to an additional digit line pair that extends in a direction opposite of the digit lines shown in FIG. 14. For example, the sense amplifier 1410(0) may be coupled to an additional digit line pair that extends to the left of the sense amplifier 1410(0), and the sense amplifier 1410(1) may be coupled to an additional digit line pair that extends to the right of the sense amplifier 1410(1).

FIG. 14 illustrates one memory cell 1415 coupled to the digit lines digit0 and digit0_bar, and one memory cell 1417 coupled to the digit lines digit1 and digit1_bar. However, additional memory cells may be coupled to the digit lines digit0 and digit0_bar, and coupled to the digit lines digit1 and digit1_bar. Additionally, additional access lines and rows of memory cells coupled to respective access lines may be included without departing from the scope of the disclosure.

The sense amplifiers 1410 may include the sense amplifier 600 of FIG. 6 in some embodiments of the disclosure. Other sense amplifiers that amplify a voltage difference between the respective digit lines of a digit line pair may be used in other embodiments of the disclosure.

The memory cells 1415 and 1417 are shown in FIG. 14 as including a capacitor storage element and a field effect transistor (FET) selection switch. The capacitor storage element may be a dielectric capacitor, ferroelectric capacitor, or other capacitor. In some embodiments of the disclosure, the memory cells 1415 and 1417 may include additional and/or alternative components. Embodiments of the disclosure are not limited to the particular memory cells shown for memory cells 1415 and 1417 in FIG. 14, and other examples of memory cells may be included.

The memory cells, digit lines, and sense amplifiers of the portion of memory 1400 may be operated as previously described with reference to FIGS. 8-11, in some embodiments of the disclosure. The memory cells, digit lines, and sense amplifiers of the portion of memory 1400 may be operated in modified and/or alternative manners in other embodiments of the disclosure.

The digit line 1422 is shared by the sense amplifiers 1410(0) and 1410(1), with the digit line 1422 representing the digit line digit0_bar associated with sense amplifier 1410(0) and the digit line 1422 representing the digit line digit1 associated with sense amplifier 1410(1). The shared digit line 1422 is coupled to the memory cells 1415 associated with the digit line pair including digit lines digit0 and digit0_bar, and coupled to the memory cells 1417 associated with the digit line pair including digit lines digit1 and digit1_bar. In some embodiments of the disclosure, a digit line pair may share both digit lines with another digit line pair (e.g., for the digit line pair including digit lines digit1 and digit1_bar, the digit line 1423 may be shared with another digit line pair). The digit line pair including digit lines digit0 and digit0_bar and the digit line pair including digit lines digit1 and digit1_bar that share the digit line 1422 may be adjacent one another. With the digit line shared between the digit line pairs of digit0 and digit0_bar and digit1 and digit1_bar, the shared digit line 1422 may have one end that is proximate to the sense amplifier 1410(0) and another end that is proximate to the sense amplifier 1410(1).

In some embodiments of the disclosure including memory cells 1415 and 1417 including a storage element and a selection switch, the shared digit line 1422 is coupled to the storage elements for the memory cells associated with one digit line pair (e.g., storage element of memory cells 1415 of digit lines digit0 and digit0_bar) and to the selection switches for the memory cells associated with another digit line pair (e.g., selection switch of memory cells 1417 of digit lines digit1 and digit1_bar).

In some embodiments of the disclosure, the digit lines digit0 and digit0_bar and digit lines digit1 and digit1_bar may be arranged in a planar manner, with the digit lines 1421, 1422, and 1423 laterally displaced from one another in a common horizontally oriented plane. In some embodiments of the disclosure, the digit lines digit0 and digit0_bar and digit lines digit1 and digit1_bar may be arranged in a vertical manner, with the digit lines 1421, 1422, and 1423 vertically displaced from one another in a common vertically oriented plane.

In some embodiments of the disclosure having a planar arrangement, additional digit line pairs having one or more shared digit lines coupled to memory cells associated with different digit line pairs and associated with different sense amplifiers may be included in other layers positioned above or below the layer of digit line pairs digit0 and digit0_bar, and digit1 and digit1_bar. The access lines WLa0 and WLa1 may be coupled to corresponding memory cells of the other layers of digit line pairs including shared digit lines.

In some embodiments of the disclosure having a vertical arrangement, additional digit line pairs having shared digit lines coupled to memory cells associated with different digit line pairs and associated with different sense amplifiers may be included in other "slices" positioned laterally from the slice of digit line pairs digit0 and digit0_bar, and digit1 and digit1_bar. The access lines WLa0 and WLa1 may be coupled to corresponding memory cells of the other slices of digit line pairs including shared digit lines. The digit line pairs of the slices corresponding to the same level as the digit line pair digit0 and digit0_bar may represent digit line pairs of a stack, and the digit line pairs of the slices corresponding to the same level as the digit line pair digit1 and digit1_bar may represent digit line pairs of another stack. An access line may be coupled to the corresponding memory cells of the other slices included in the same stack.

Embodiments of the disclosure including digit line pairs having one or more shared digit lines, and having memory cells associated with one digit line pair coupled to the shared digit line that is also coupled to memory cells associated with another digit line pair may provide a more compact arrangement for the digit line pairs, memory cells, and sense amplifiers. Such arrangements may allow for including fewer digit lines for a same number of digit line pairs compared to an arrangement that does not share a digit line between digit line pairs.

The arrangement of the memory cells, digit lines, and sense amplifiers of the portion of memory 1400 of FIG. 14 may be expanded to provide several adjacent memory cells, digit lines, and sense amplifiers, for example, to be included in a memory array.

Figure 15:
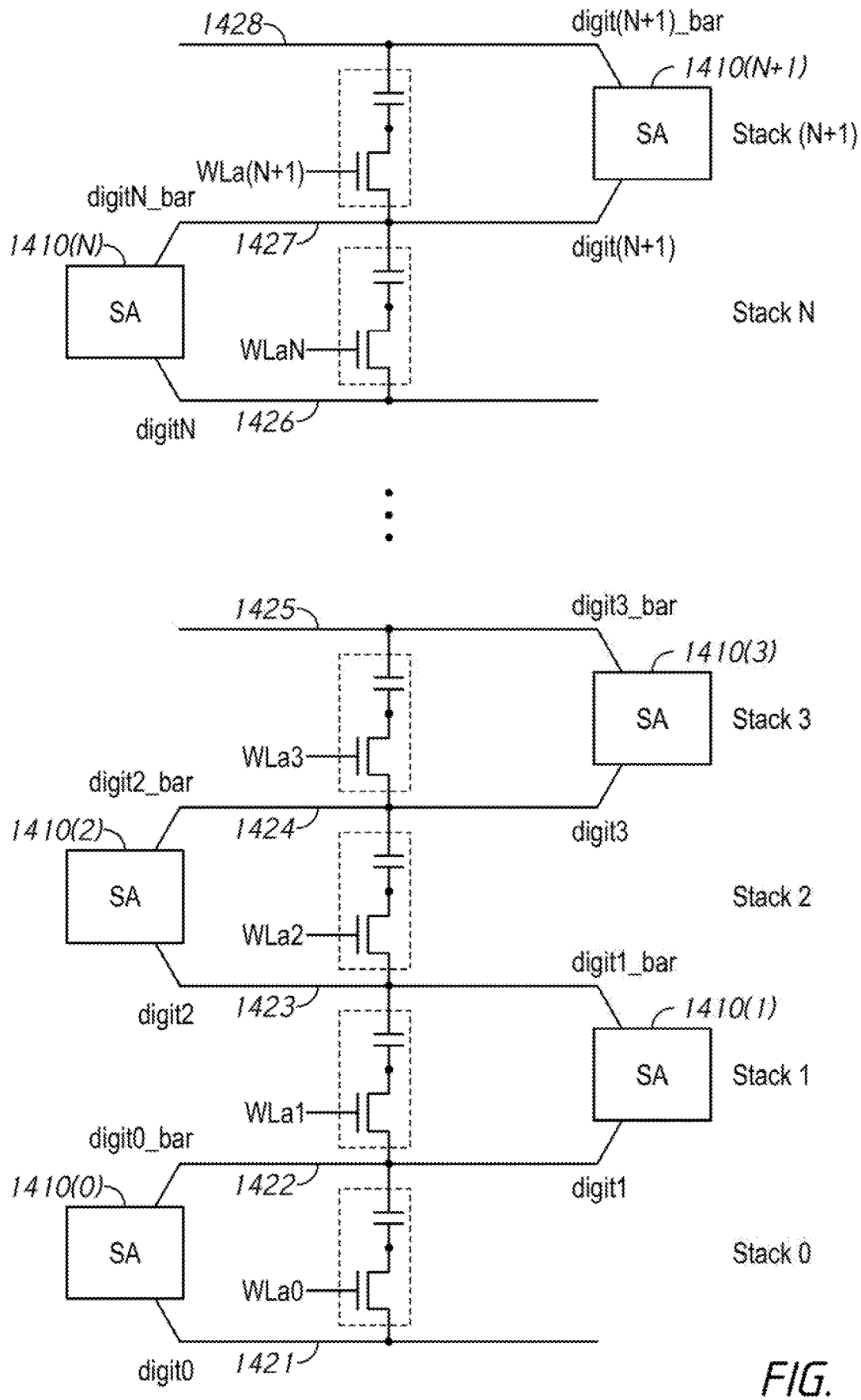
FIG. 15 is a diagram of a portion of a memory that includes sense amplifiers and memory cells coupled to pairs of digit lines according to an embodiment of the disclosure.

FIG. 15 is a diagram of a portion of a memory 1500 that includes sense amplifiers and memory cells coupled to pairs of digit lines according to an embodiment of the disclosure.

The portion of memory 1500 may be included in the semiconductor device 100 in some embodiments of the disclosure.

The memory cells 1415 and 1417, digit lines 1421, 1422, and 1423, and sense amplifiers 1410 of FIG. 14 are shown in FIG. 15. Additional memory cells, digit lines, and sense amplifiers are also shown. Access lines WLa0 and WLa1, as well as access lines WLa2-WLa(N+1) are also shown in FIG. 15, each coupled to corresponding memory cells of the additional memory cells. When an access line is activated (e.g., a high access line voltage level), the memory cells coupled to the access line are activated for access, as previously described.

The arrangement shown in FIG. 15 includes digit line pairs including one or more shared digit lines. For example, the digit line pair including digit0 and digit0_bar shares digit line 1422 with the digit line pair including digit1 and digit1_bar, the digit line pair including digit1 and digit1_bar also shares digit line 1423 with the digit line pair including digit2 and digit2_bar; the digit line pair including digit2 and digit2_bar also shares digit line 1424 with the digit line pair including digit3 and digit3_bar; and the digit line pair including digitN and digitN_bar shares digit line 1427 with the digit line pair including digit(N+1) and digit(N+1)_bar. Digit lines 1425 and 1426 may also be shared, although FIG. 15 does not illustrate the digit line pairs sharing the digit lines 1425 and 1426.

As with the portion of a memory 1400 previously described, the digit line pairs and memory cells of the portion of memory 1500 may be arranged in a planar manner in some embodiments of the disclosure. In other embodiments of the disclosure, the digit line pairs and memory cells of the portion of memory 1500 may be arranged in a vertical manner. In an embodiment of the disclosure including the digit line pairs and memory cells arranged in a vertical matter, the digit line pairs and memory cells may represent a slice, and additional adjacent slices may be disposed laterally. Each of the corresponding digit pairs of the slices may represent digit line pairs of a stack. For example, digit line pairs of the slices corresponding to the digit line pair including digit0 and digit0_bar represent one stack; digit line pairs of the slices corresponding to the digit line pair including digit1 and digit1_bar represent another stack; digit line pairs of the slices corresponding to the digit line pair including digit2 and digit2_bar represent another stack; and so on.

As previously described, including digit line pairs sharing a common digit line, and having memory cells associated with each of the digit line pairs coupled to both digit lines of the respective pair may provide for a more compact arrangement for the digit line pairs, memory cells, and sense amplifiers.

From the foregoing it will be appreciated that, although specific embodiments of the disclosure have been described herein for purposes of illustration, various modifications may be made without deviating from the spirit and scope of the disclosure. In some embodiments of the disclosure, aspects of any of the embodiments may be combined to provide additional embodiments of the disclosure. For example, in some embodiments of the disclosure, memory cells may be coupled to both digit lines of a digit line pair that includes one or more digit lines twists (e.g., as previously described with reference to FIGS. 12 and 13), and also includes a digit line that is shared with another digit line pair (e.g., as previously described with reference to FIGS. 14 and 15). Accordingly, the scope of the disclosure should not be limited any of the specific embodiments described herein.

What is claimed is:

1. An apparatus, comprising:
   a pair of digit lines including first and second digit lines, and the pair of digit lines includes a digit line twist;
   a sense amplifier coupled to the pair of digit lines and configured to amplify a voltage difference between the first and second digit lines when activated;
   a plurality of memory cells, a memory cell of the plurality of memory cells including a first node coupled to the first digit line and including a second node coupled to the second digit line, the memory cell of the plurality of memory cells configured to store a respective voltage and/or charge at a respective cell node and couple the respective voltage and/or charge to the first node when activated; and
   a second memory cell of the plurality of memory cells coupled to the pair of digit lines on a different side of the digit line twist from the memory cell of the plurality of memory cells, the second memory cell of the plurality of memory cells including a first node coupled to the second digit line and including a second node coupled to the first digit line, the second memory cell of the plurality of memory cells configured to store a respective voltage and/or charge at a respective cell node and couple the respective voltage and/or charge to the first node when activated, wherein the first digit line and the second digit line are vertically displaced relative to one another, and wherein the first digit line and the second digit line are laterally displaced relative to a third digit line and a fourth digit line of a second pair of digit lines, wherein the second pair of digit lines do not include a digit line twist and the second pair of digit lines are adjacent the first pair of digit lines, the apparatus further comprising:
   a second sense amplifier coupled to the second pair of digit lines and configured to amplify a voltage difference between the third and fourth digit lines of the second pair of digit lines when activated;
   a second plurality of memory cells, each memory cell of the second plurality of memory cells including a first node coupled to the same third digit line of the second pair of digit lines and including a second node coupled to the same fourth digit line of the second pair of digit lines, each memory cell of the second plurality of memory cells configured to store a respective voltage and/or charge at a respective cell node and couple the respective voltage and/or charge to the first node when activated.

2. The apparatus of claim 1 wherein the memory cell of the plurality of memory cells comprises:
   a storage element coupled to the first node and the cell node; and
   a selection switch coupled to the second node and the cell node, the selection switch including a control node coupled to an access line.

3. The apparatus of claim 2 wherein the storage element comprises a dielectric capacitor and the selection switch comprises a field effect transistor.

4. The apparatus of claim 2 wherein the storage element comprises a ferroelectric capacitor and the selection switch comprises a field effect transistor.

5. The apparatus of claim 1 wherein the memory cell of the plurality of memory cells comprises:
   a storage element coupled to the first node and the cell node; and
   a selection switch coupled to the second node and the cell node, and wherein the second memory cell of the plurality of memory cells comprises:
a storage element coupled to the second node and a cell node of the second memory cell of the plurality of memory cells; and
a selection switch coupled to the first node and the cell node.

6. The apparatus of claim 1 wherein the first and second digit lines of the pair of digit lines are arranged vertically.

7. The apparatus of claim 1, further comprising:
a third pair of digit lines including a fifth digit line and sharing the second digit line of the pair of digit lines;
a second sense amplifier coupled to the fifth digit line and the second digit line, and configured to amplify a voltage difference between the fifth and second digit lines when activated; and
a third plurality of memory cells, a memory cell of the third plurality of memory cells including a first node coupled to the second digit line and a second node coupled to the fifth digit line, the memory cell of the third plurality of memory cells configured to store a respective voltage and/or charge at a respective cell node and couple the respective voltage and/or charge to the first node when activated.

8. The apparatus of claim 7 wherein the first, second and fifth digit lines are arranged vertically.

9. An apparatus, comprising:
a plurality of digit line pairs;
a plurality of sense amplifiers, each sense amplifier coupled to a respective digit line pair of the plurality of digit line pairs, and when activated, configured to amplify a voltage difference between digit lines of the respective digit line pair of the plurality of digit line pairs; and
a plurality of memory cells, a first memory cell of the plurality of memory cells including a first node coupled to a first digit line of a respective one of the plurality of digit line pairs and including a second node coupled to a second digit line of the respective one of the plurality of digit line pairs, the first memory cell of the plurality of memory cells further including a first selection switch coupled to a first cell node of the first memory cell and the first node and configured to provide a voltage from the first cell node to the first node, the first memory cell of the plurality of memory cells further including a storage element coupled to the cell node of the memory cell and the second node,
a second memory cell of the plurality of memory cells, the second memory cell including a third node coupled to the second digit line to share the second digit line with the first memory cell, the second memory cell further including a second selection switch coupled to a second cell node of the second memory cell and the third node, and
wherein the first digit line and the second digit line are vertically displaced relative to one another.

10. The apparatus of claim 9 wherein each digit line pair of the plurality of digit line pairs includes a digit line twist.

11. A method, comprising:
activating an access line coupled to a memory cell to activate the memory cell;
providing from a cell node of the activated memory cell a stored voltage to a first digit line coupled to the activated memory cell;
capacitively coupling across a storage element of the activated memory cell a change in voltage of the cell node of the activated memory cell to a second digit line coupled to the activated memory cell, the first digit line and the second digit line comprising a first pair of digit lines; and
activating a sense amplifier coupled to the first and second digit lines to amplify a voltage difference between the first and second digit lines resulting from providing the stored voltage to the first digit line and capacitively coupling a change in voltage of the cell node to the second digit line,
wherein the first digit line and second digit line are vertically displaced relative to one another, wherein the second digit line is shared with an additional memory cell, and wherein the second digit line is coupled to a selection switch of the additional memory cell via a node of the additional memory cell.

12. The method of claim 11, further comprising:
deactivating the access line to deactivate the memory cell; and
precharging the first and second digit lines to a precharge voltage,
wherein precharging the second digit line to the precharge voltage causes a voltage change in the voltage of the second digit line and the voltage change of the second digit line is capacitively coupled to the cell node across the storage element to change the voltage stored at the cell node.

13. The method of claim 11, wherein the voltage change of the second digit line capacitively coupled to the cell node causes the voltage stored at the cell node to be greater than a high level activation voltage of the sense amplifier or to be less than a low level activation voltage of the sense amplifier.

14. The method of claim 11, further comprising:
while the memory cell is activated, in an un-accessed memory cell coupled to the first and second digit lines,
in response to providing the stored voltage from the cell node of the activated memory cell to the first digit line, capacitively coupling a first change in voltage of the second digit line across a storage element of the un-accessed memory cell to a cell node of the un-accessed memory cell and changing a voltage of the cell node of the un-accessed memory cell; and
in response to activating the sense amplifier to amplify the voltage difference between the first and second digit lines, capacitively coupling a second change in the voltage of the second digit line across the storage element of the un-accessed memory cell to the cell node of the un-access memory cell and further changing the voltage of the cell node of the un-accessed memory cell.

* * * * *